(12) United States Patent (10) Patent No.: US 9,142,545 B2
Chen et al. (45) Date of Patent: Sep. 22, 2015

(54) ELECTROSTATIC DISCHARGE PROTECTION STRUCTURE CAPABLE OF PREVENTING LATCH-UP ISSUE CAUSED BY UNEXPECTED NOISE

(71) Applicant: UNITED MICROELECTRONICS CORP., Hsin-Chu (TW)

(72) Inventors: Yi-Chun Chen, Pingtung County (TW); Li-Cih Wang, Taoyuan County (TW); Lu-An Chen, Hsinchu County (TW); Tien-Hao Tang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/181,740

(22) Filed: Feb. 17, 2014

(65) Prior Publication Data

US 2015/0236010 A1 Aug. 20, 2015

(51) Int. Cl.
*H01L 27/02* (2006.01)
*H01L 27/06* (2006.01)

(52) U.S. Cl.
CPC ........ *H01L 27/0262* (2013.01); *H01L 27/0623* (2013.01)

(58) Field of Classification Search
CPC ............ H01L 27/0248; H01L 27/0266; H01L 27/0264; H01L 27/0262; H01L 27/02; H01L 29/87

See application file for complete search history.

(56) References Cited

U.S. PATENT DOCUMENTS

| 6,365,924 B1 | 4/2002 | Wang et al. |
| 7,034,363 B2 | 4/2006 | Chen |
| 2006/0258067 A1* | 11/2006 | Jeon et al. ..................... 438/154 |

* cited by examiner

*Primary Examiner* — Thanhha Pham
(74) *Attorney, Agent, or Firm* — Winston Hsu; Scott Margo

(57) ABSTRACT

The electrostatic discharge protection structure includes an N-well disposed on a substrate, a P-well disposed on the substrate and adjacent to the N-well, a first doped region of N-type conductivity disposed in the N-well, a second doped region of N-type conductivity disposed in the N-well, a third doped region of P-type conductivity disposed in the N-well, a fifth doped region of P-type conductivity disposed in the P-well, a fourth doped region of N-type conductivity disposed between the third doped region and the fifth doped region in the P-well, an anode electrically connected to the first doped region and the second doped region, and a cathode electrically connected to the fourth doped region and the fifth doped region.

14 Claims, 3 Drawing Sheets

ELECTROSTATIC DISCHARGE PROTECTION STRUCTURE CAPABLE OF PREVENTING LATCH-UP ISSUE CAUSED BY UNEXPECTED NOISE

BACKGROUND OF THE INVENTION

1. Field of the Invention

The invention relates to an electrostatic discharge protection structure, and more particularly, to an electrostatic discharge protection structure capable of preventing the latch-up issue caused by unexpected noise.

2. Description of the Prior Art

Electrostatic discharge (ESD) is an effect of electric charges moving rapidly between two electrically charged objects through a discharge path in a short period of time caused by contacting or short circuiting. Electrostatic discharge can damage components of an integrated circuit. Since the human body, machines used to package integrated circuits, and instruments for testing integrated circuits are all common charged bodies, the static electric charges of a charged body may discharge to a chip and cause irreversible harm to the chip once the charged body contacts with the chip. Therefore, an electrostatic discharge protection device is designed to provide a discharge path and to protect the integrated circuit from being blown out by an instantaneous discharge current.

In addition to the electrostatic clamp, which is a known electrostatic discharge protection apparatus, silicon controlled rectifier (SCR) is another popular electrostatic discharge protection apparatus. When an SCR is triggered by a triggering voltage, it will go into a snapback breakdown condition. Once the SCR enters the snapback breakdown condition, the SCR will become a low resistance path and clamp the holding voltage in a lower level. The low resistance path can provide a discharge path when the electrostatic discharge occurs so the discharge current will not flow through the integrated circuit and damage the chip.

However, the holding voltage is found to be much smaller than the power supply voltage for high-voltage devices. Such characteristics will cause the IC to be susceptible to the latch-up danger in practical system applications.

SUMMARY OF THE INVENTION

One embodiment of the present invention discloses an electrostatic discharge protection structure. The electrostatic discharge protection structure includes an N-well disposed on a substrate, a P-well disposed on the substrate and adjacent to the N-well, a first doped region of N-type conductivity disposed in the N-well, a second doped region of N-type conductivity disposed in the N-well, a third doped region of P-type conductivity disposed in the N-well, a fifth doped region of P-type conductivity disposed in the P-well, a fourth doped region of N-type conductivity disposed between the third doped region and the fifth doped region in the P-well, an anode electrically connected to the first doped region and the second doped region, and a cathode electrically connected to the fourth doped region and the fifth doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
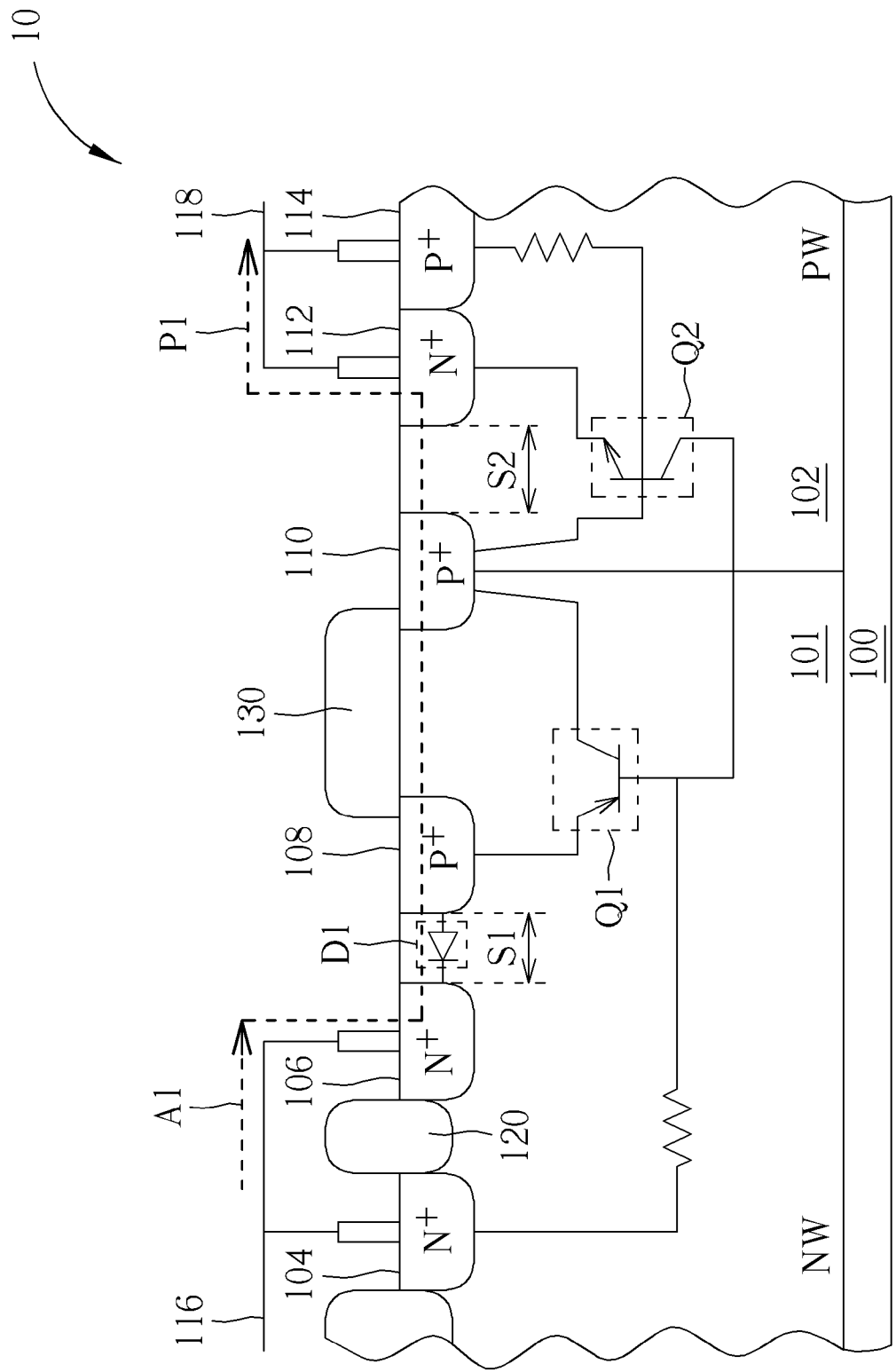
FIGS. 1 to 3 show electrostatic discharge protection structures according to embodiments of the present invention based on the structure of PSCR.

FIG. 1 shows an electrostatic discharge protection structure 10 according to a first embodiment of the present invention based on the structure of PMOS silicon-controlled rectifier (PSCR). Referring to FIG. 1, the electrostatic discharge protection structure 10 includes a substrate 100, an N-well 101, a P-well 102, a first doped region 104, a second doped region 106, a third doped region 108, a fourth doped region 112, a fifth doped region 114, a six doped region 110, an anode 116, and a cathode 118. The third doped region 108, the fifth doped region 114, and the sixth doped region 110 are P$^+$ doped regions while the first doped region 104, the second doped region 106, and the fourth doped region 112 are N$^+$ doped regions. The N-well 101 is disposed on the substrate 100 and the P-well 102 is disposed on the substrate 100 adjacent to the N-well 101. The first doped region 104, the second doped region 106, and the third doped region 108 are disposed in the N-well 101. The fourth doped region 112 and the fifth doped region 114 are disposed in the P-well 102. The fourth doped region 112 is disposed between the third doped region 108 and the fifth doped region 118. The sixth doped region 110 is disposed at the boundary of the N-well 101 and the P-well 102 and between the third doped region 108 and the fourth doped region 112. In one embodiment, the width of the sixth doped region is between 0 µm and 5 µm.

The first to sixth doped regions 104, 106, 108, 112, 114 and 110 have a higher doping concentration than the N-well 101 and P-well 102. In one embodiment, the doping concentration of the N-well 101 and P-well 102 is from $10^{17}$ to $10^{19}$ cm$^{-3}$, and the doping concentration of the first to sixth doped regions 104, 106, 108, 112, 114 and 110 is from $10^{19}$ to $10^{21}$ cm$^{-3}$. Furthermore, depths of the first to sixth doped regions 104, 106, 108, 112, 114 and 110 are smaller than depths of the N-well 101 and the P-well 102. In one embodiment, the depth of the N-well 101 and the P-well 102 is from 0 µm to 3 µm, and the depth of each of the doped regions 104, 106, 108, 110, 112 and 114 is from 0 µm to 0.3 µm.

The anode 116 is electrically connected to the first doped region 104 and the second doped region 106. The cathode 118 is electrically connected to the fourth doped region 112 and the fifth doped region 114.

Figure 2:
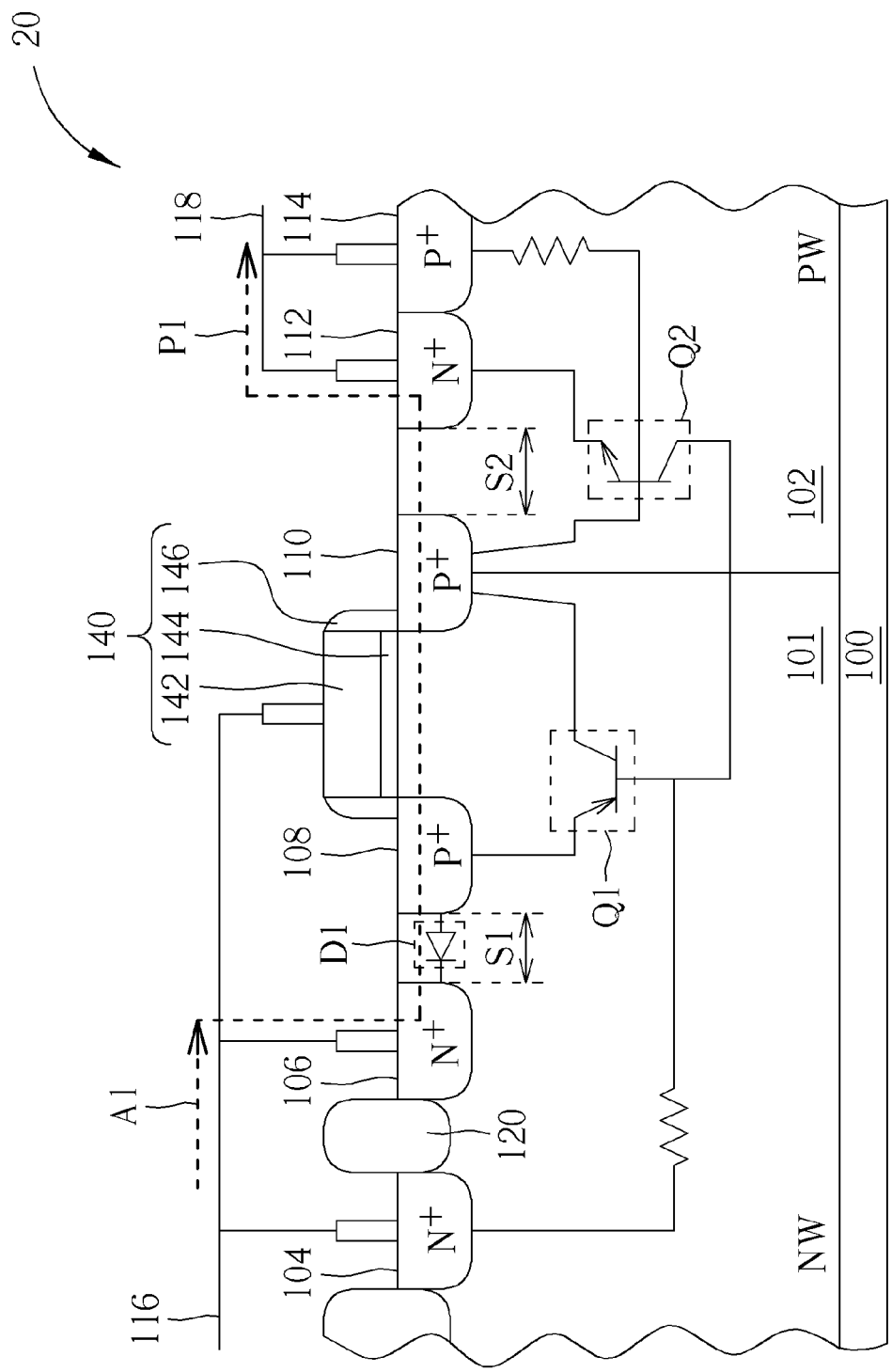

The first doped region 104 and the second doped region 106 can be separated by an isolation structure 120 as shown in FIG. 1. The isolation structure 120 can be a field oxide or a shallow trench isolation structure. Moreover, the electrostatic discharge protection structure 10 includes an isolation structure 130 between the third doped region 108 and the six doped region 110 as shown in FIG. 1. In one embodiment, the isolation structure 130 can be a field oxide or a shallow trench isolation structure. Referring to FIG. 2, FIG. 2 shows an electrostatic discharge protection structure 20 according to a second embodiment of the present invention. Instead of including an isolation structure 130, the electrostatic discharge protection structure 30 includes a gate structure 240 on the N-well 101. The gate structure 240 may include a gate 242, a gate dielectric layer 244, and a spacer 246. The material of the gate 242 can be a conductor such as metal or doped polysilicon. The material of the gate dielectric layer 244 can be an insulator such as silicon oxide or a high dielectric constant material. The material of the spacer 246 can be an insulator such as silicon oxide. The gate structure 240 is electrically connected to the anode 116.

Referring to FIG. 1, a PNP bipolar junction transistor Q1 is formed by the third doped region 108, the N-well 101, and the sixth doped region 110. In addition, an NPN bipolar junction transistor Q2 is formed by the N-well 101, the sixth doped region 110, and the fourth doped region 112. In the embodiment of FIG. 1, a current A1 flows from the anode 116 to the cathode 118 through the second doped region 106, the third doped region 108, the N-well 101, the sixth doped region 110, and the fourth doped region 112. Consequently, the path P1 of current A1 contains a laminated structure of $N^+/P^+/NW/P^+/N^+$, forming a PSCR.

The second doped region 106 and the third doped region 108 form a reversed diode D1 on the path P1. Since the anode 116 is not connected to the third doped region 108, the current flows into the second doped region 106 will go through the third doped region 108 before it enters the PNP bipolar junction transistor Q1. Therefore, the discharge current will have to overcome a breakdown voltage of the reversed diode D1. That is, the holding voltage $V_h$ of the electrostatic discharge protection structure 10 is increased by an amount of the breakdown voltage of the reversed diode D1, for instance, about 6-7V.

Moreover, when the distance S1 between the second doped region 106 and the third doped region 108 increases, the breakdown voltage of the reversed diode D1 also increases. Therefore, the holding voltage $V_h$ of the electrostatic discharge protection structure 10 can be adjusted by adjusting the distance S1 between the second doped region 106 and the third doped region 108. The distance S1 can range from 0 μm to 1 μm. Also, when the distance S2 between the sixth doped region 110 and the fourth doped region 112 increases, the resistance between the two doped region increases. The increased resistance increases the voltage barrier along the path P1. Therefore, the holding voltage $V_h$ of the electrostatic discharge protection structure 10 can further be adjusted by adjusting the distance S2.

In addition, since the reversed diode D1 is located at the emitter of the PNP bipolar junction transistor Q1, the NPN bipolar junction transistor Q2 is actually turned on before the first bipolar junction transistor Q1 while an external voltage is applied to the anode and the cathode. Once the NPN bipolar junction transistor Q2 is turned on, the NPN bipolar junction transistor Q2 can help to turn on the PNP bipolar junction transistor Q1. Since the driving power of the NPN bipolar junction transistor Q2 is greater than the PNP bipolar junction transistor Q1 under the same condition, the triggering voltage $V_t$ of the electrostatic discharge protection structure 10 can be kept low enough to prevent the circuit from breakdown.

Figure 3:
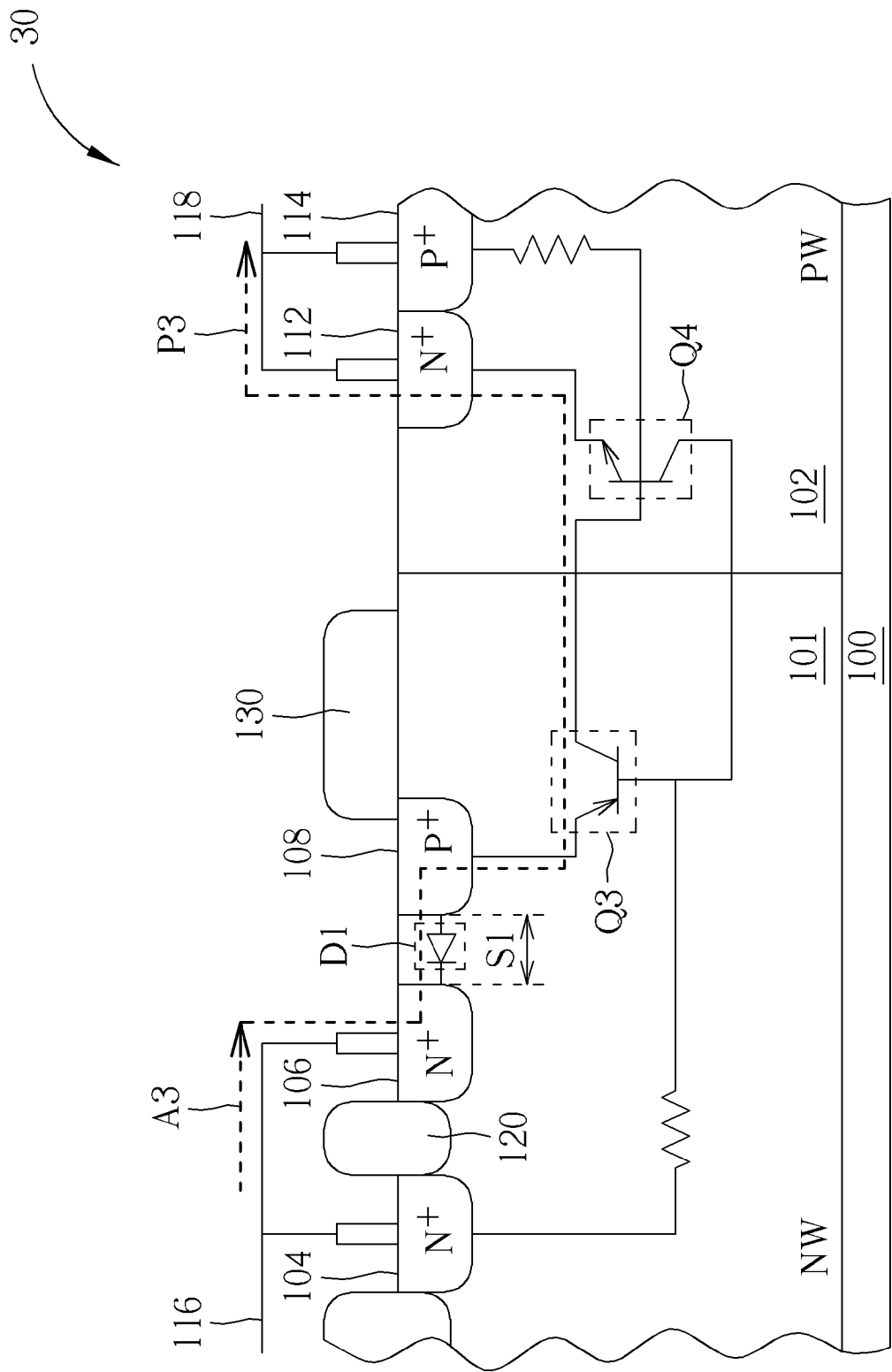

Referring to FIG. 3, FIG. 3 shows an electrostatic discharge protection structure 30 according to a third embodiment of the present invention. The electrostatic discharge protection structure 30 is different from the electrostatic discharge protection structure 10 in that the electrostatic discharge protection structure 30 has a total of five doped regions 104, 106, 108, 112 and 114. Further, the isolation structure 130 is formed between the third doped region 108 and the fourth doped region 112. Therefore, the discharge current in the electrostatic discharge protection structure 30 has a different route as explained hereinafter. Referring to FIG. 3, a PNP bipolar junction transistor Q3 is formed by the third doped region 108, the N-well 101, and the P-well 102. In addition, an NPN bipolar junction transistor Q4 is formed by the N-well 101, the P-well 102, and the fourth doped region 112. In the embodiment of FIG. 3, a current A3 flows from the anode 116 to the cathode 118 through the second doped region 106, the third doped region 108, the N-well 101, the P-well 102, and the fourth doped region 112. Consequently, the path P3 of current A3 contains a laminated structure of $N^+/P^+/NW/PW/N^+$, forming a PSCR.

The second doped region 106 and the third doped region 108 form a reversed diode D1 on the path P3. As a result, the discharge current will have to overcome a breakdown voltage of the reversed diode D1. That is, the holding voltage $V_h$ of the electrostatic discharge protection structure 30 is increased by an amount of the breakdown voltage of the reversed diode D1. Also, the holding voltage $V_h$ of the electrostatic discharge protection structure 30 can be adjusted by adjusting the distance S1 between the second doped region 106 and the third doped region 108. Since the reversed diode D1 is located at the emitter of the PNP bipolar junction transistor Q3, the NPN bipolar junction transistor Q4 is actually turned on before the first bipolar junction transistor Q3 while an external voltage is applied to the anode and the cathode. Once the NPN bipolar junction transistor Q4 is turned on, the NPN bipolar junction transistor Q4 can help to turn on the PNP bipolar junction transistor Q3. Since the driving power of the NPN bipolar junction transistor Q4 is greater than the PNP bipolar junction transistor Q3 under the same condition, the triggering voltage $V_t$ of the electrostatic discharge protection structure 30 can be kept low enough to prevent the circuit from breakdown.

As described above, this invention provides electrostatic discharge protection structures with a reversed diode inserted at the emitter of the PNP bipolar junction transistor so the electrostatic discharge protection structures are capable of increasing the holding voltage $V_h$ to levels larger than the system supply voltage while keeping the triggering voltage $V_t$ within levels lower than the oxide breakdown voltage to prevent the latch-up issue caused by unexpected noise and provide a thorough protection to circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection structure, comprising:
    an N-well disposed on a substrate;
    a P-well disposed on the substrate and adjacent to the N-well;
    a first doped region of N-type conductivity disposed in the N-well;
    a second doped region of N-type conductivity disposed in the N-well;
    a third doped region of P-type conductivity disposed in the N-well;
    a fourth doped region of N-type conductivity disposed in the P-well;
    a fifth doped region of P-type conductivity disposed in the P-well, wherein the fourth doped region is disposed between the third doped region and the fifth doped region;
    an anode electrically connected to the first doped region and the second doped region; and
    a cathode electrically connected to the fourth doped region and the fifth doped region;
    wherein no insolation structure is formed between the second doped region and the third doped region.

2. The electrostatic discharge protection structure of claim 1, further comprising an isolation structure disposed between the first doped region and the second doped region.

3. The electrostatic discharge protection structure of claim 2, wherein the isolation structure is a field oxide layer or a shallow trench isolation structure.

4. The electrostatic discharge protection structure of claim 1, further comprising a gate structure disposed between the third doped region and the fourth doped region and electrically connected to the anode.

5. The electrostatic discharge protection structure of claim 1, further comprising an isolation structure disposed between the third doped region and the fourth doped region.

6. The electrostatic discharge protection structure of claim 5, wherein the isolation structure is a field oxide layer or a shallow trench isolation structure.

7. The electrostatic discharge protection structure of claim 1, wherein a distance between the second doped region and the third doped region is between 0 μm~1 μm.

8. The electrostatic discharge protection structure of claim 1, further comprising a sixth doped region of P-type conductivity disposed at a boundary of the N-well and the P-well and between the third doped region and the fourth doped region.

9. The electrostatic discharge protection structure of claim 8, further comprising a gate structure disposed between the third doped region and the sixth doped region and electrically connected to the anode.

10. The electrostatic discharge protection structure of claim 8, further comprising an isolation structure disposed between the third doped region and the sixth doped region.

11. The electrostatic discharge protection structure of claim 8, wherein a distance between the fourth doped region and the sixth doped region is between 0 μm and 5 μm.

12. The electrostatic discharge protection structure of claim 8, wherein a width of the sixth doped region is between 0 μm and 5 μm.

13. The electrostatic discharge protection structure of claim 8, wherein a doping concentration of the sixth doped regions is from $10^{19}$ to $10^{21}$ cm$^{-3}$, and a depth of the sixth doped regions is from 0 μm to 0.3 μm.

14. The electrostatic discharge protection structure of claim 1, wherein a doping concentration of the N-well is from $10^{17}$ to $10^{19}$ cm$^{-3}$, a depth of the N-well is from 0 μm to 3 μm, a doping concentration of the P-well is from $10^{17}$ to $10^{19}$ cm$^{-3}$, a depth of the P-well is from 0 μm to 3 μm, a doping concentration of each of the five doped regions is from $10^{19}$ to $10^{21}$ cm$^{-3}$, and a depth of each of the five doped regions is from 0 μm to 0.3 μm.

* * * * *